United States Patent
Francis et al.

(10) Patent No.: US 6,197,649 B1
(45) Date of Patent: Mar. 6, 2001

(54) PROCESS FOR MANUFACTURING PLANAR FAST RECOVERY DIODE USING REDUCED NUMBER OF MASKING STEPS

(75) Inventors: Richard Francis, Manhattan Beach; Chiu Ng, El Segundo, both of CA (US)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 09/129,165

(22) Filed: Aug. 5, 1998

(51) Int. Cl.$^7$ .................................................. H01L 21/331
(52) U.S. Cl. ............................................. 438/380; 257/481
(58) Field of Search ..................................... 438/225, 226, 438/380, 439, 526, 527; 257/481

(56) References Cited

U.S. PATENT DOCUMENTS

| | | | | |
|---|---|---|---|---|
| 4,692,995 | * | 9/1987 | Blanchard | 438/533 |
| 5,091,332 | * | 2/1992 | Bohr et al. | 438/450 |
| 5,250,449 | * | 10/1993 | Kuroyanagi et al. | 438/137 |
| 5,451,544 | * | 9/1995 | Gould | 438/652 |
| 5,719,421 | * | 2/1998 | Hutter et al. | 257/335 |
| 5,837,378 | * | 11/1998 | Mathews et al. | 438/439 |

OTHER PUBLICATIONS

S. Wolf, Silicon Process for the VLSI Era, vols. 1–2, (Lattice Press, California, 1986 and 1990).*
S. M. Sze, Physics of Semiconductor Devices, (John Wiley & Sons, New York, 1981), p. 64.*

* cited by examiner

Primary Examiner—Richard Elms
Assistant Examiner—Christian D. Wilson
(74) Attorney, Agent, or Firm—Ostrolenk, Faber, Gerb & Soffen, LLP (57) ABSTRACT

A fast recovery diode (FRED) is fabricated by a process using a reduced number of masking steps. The FRED is a vertical conduction device in which P type anode regions are isolated using either LOCOS oxidation or deposited low temperature oxide. The first masking step defines the anode and isolation regions, and a second masking step defines the aluminum contact layer. For devices having a breakdown voltage greater than 800 volts, a third masking step is included which defines the passivated area.

20 Claims, 14 Drawing Sheets

*FIG. 4E*

PROCESS FOR MANUFACTURING PLANAR FAST RECOVERY DIODE USING REDUCED NUMBER OF MASKING STEPS

BACKGROUND OF THE INVENTION

This invention relates to processes for the manufacture of semiconductor devices and, more specifically, to a fast recovery diode (FRED) that is manufactured using a reduced number of masking steps.

Typically, the process for fabricating a FRED requires four or five masking steps. A first masking step defines the termination and P-type anode regions. A second masking step defines the contact region, and then a third masking step defines the deposited metal. Subsequently, a passivation layer is defined using a fourth masking step. Additionally, further masking steps may be incorporated for defining an equipotential ring (EQR) as well as for defining an enhancement termination implant.

Each of these masking steps may include a critical mask alignment, which adds manufacturing time and expense. Furthermore, each of the masking steps provides a possible source of device defects, as are caused by particles attached to the mask from the photoresist.

It is therefore desirable to minimize the number of critical alignments necessary as well as to reduce the number of masking steps to improve the manufacturing yield and reduce the manufacturing cost.

SUMMARY OF THE INVENTION

The present invention provides a novel process for the manufacture of vertical conduction fast recovery diodes in which only two or three masking steps are used. Only two masking steps are needed for manufacturing devices having a breakdown voltage rated at less than 800 volts. For higher voltage rated devices, an additional masking step is used to define the passivation layer. The FRED may be manufactured using localized oxidation of silicon (LOCOS) or using deposited low temperature oxide (LTO).

According to an aspect of the invention, a semiconductor device is fabricated by first forming at least one layer of first insulation material atop an upper surface of a silicon substrate which is of one conductivity type. Impurities of another conductivity type are then introduced into the upper surface of the silicon substrate. Selected regions of the first insulation material are patterned and etched away to form openings which expose underlying regions of the upper surface of the silicon substrate, and localized oxide regions are formed in the underlying regions. The layer of first insulation material is then removed to expose remaining unoxidized regions of the silicon substrate. An upper conductive layer is deposited, and selected regions of the layer are patterned and etched away to form openings which expose a bordering portion of the silicon substrate. Impurities of the one conductivity type are introduced into the openings of the bordering portion to form equipotential rings.

According to another aspect of the invention, a semiconductor device is fabricated by first forming at least an upper layer of insulation material on at least the upper surface of a silicon substrate of one conductivity type. Selected regions of the insulation material are patterned and etched away to form openings therein which expose underlying regions of the upper surface, and impurities of another conductivity type are introduced into the underlying regions to form diffused regions. An upper conductive layer is deposited, and selected regions thereof are patterned and etched away to form openings which expose at least bordering regions of the upper surface of the silicon substrate. Impurities of the one conductivity type are introduced into the bordering regions to form at least one equipotential ring.

Other features and advantages of the present invention will become apparent from the following description of the invention which refers to the accompanying drawings.

BRIEF DESCRIPTION OF THE DRAWINGS

The invention will now be described in greater detail in the following detailed description with reference to the drawings in which.

DETAILED DESCRIPTION OF THE INVENTION

Referring first to FIGS. 1A to 1L, there is shown a reduced masking step process for the manufacture of a FRED according to a first aspect of the invention.

Figure 1A:
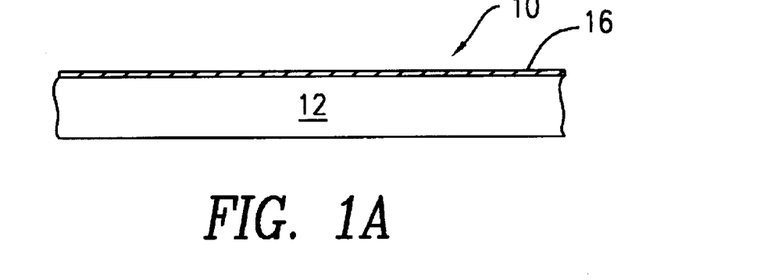
FIGS. 1A–1L show cross-sectional views of the manufacture of a portion of a FRED chip within a silicon wafer according to a process of the invention.

FIG. 1A shows a portion of a wafer 10 having a N-type body 12 formed of monocrystalline silicon. An initial oxidation step that forms an oxide layer is followed by an LPCVD deposition step of a nitride layer to form combined layer 16 which provides a total thickness of the two films of between 1500 to 2500 angstroms, for example.

Figure 1B:
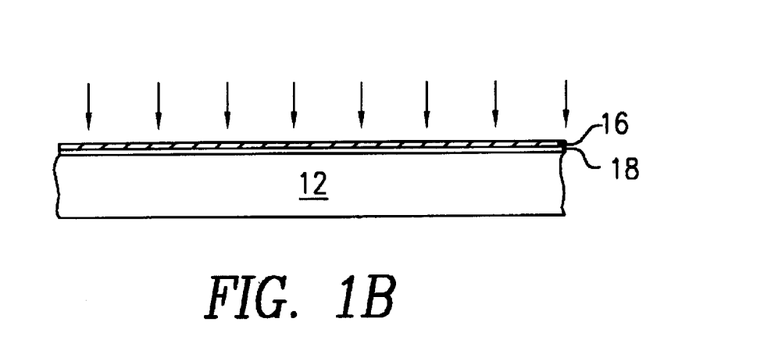

Then, as FIG. 1B shows, a blanket boron implant is carried out into the upper surface of the wafer at an energy of about 50 to 80 KeV and at a dose of between 1 E13 to 1 E15, for example, to form regions 18.

Figure 1C:
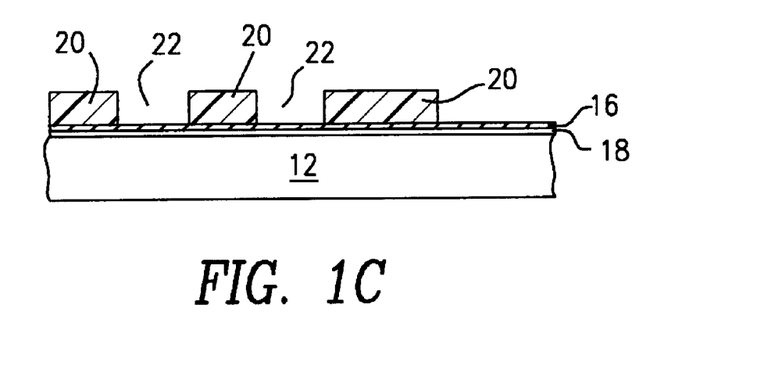
Figure 1D:
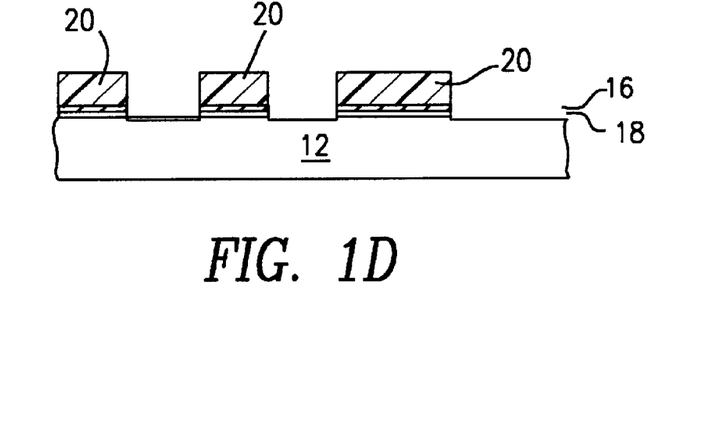

A suitable photoresist layer 20 is then formed atop the layer 16 and is patterned by a first photolithographic masking step to form openings 22 therein, as FIG. 1C shows. Thereafter, an anisotropic etching step removes the exposed portions of the silicon nitride layer and the silicon dioxide layer, as shown in FIG. 1D. Then, the exposed portion of the silicon substrate is etched to form trenches having a depth of about 0.2 to 1 microns.

Figure 1E:
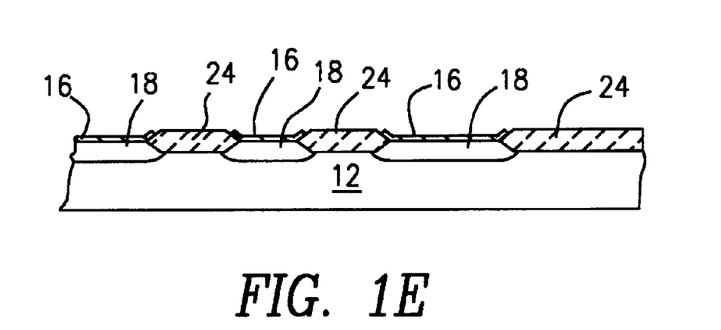

Thereafter, the photoresist layer 20 is stripped, and a diffusion of about 120 to 240 minutes is carried out at a temperature of 1100 to 1200° C. to drive in the P-type boron implant. At the same time, a LOCOS oxide layer 24 is grown in the exposed trenches of the silicon to provide electrical isolation between the diffused P-type regions 18.

Figure 1F:
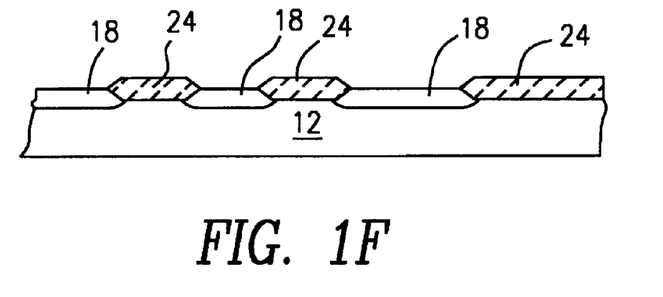
Figure 1G:
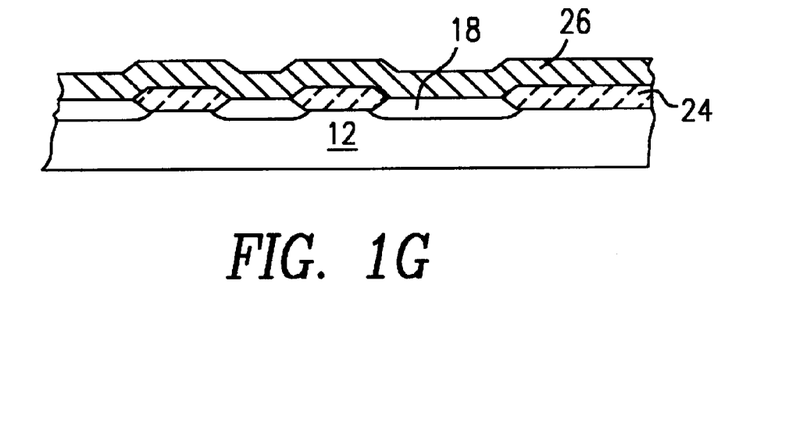

Then, as FIG. 1F shows, the nitride and initial oxide layers 16 are removed to expose the P$^+$ diffusions 18. A blanket layer of aluminum 26 is then sputtered onto the top surface, as FIG. 1G shows.

Figure 1H:
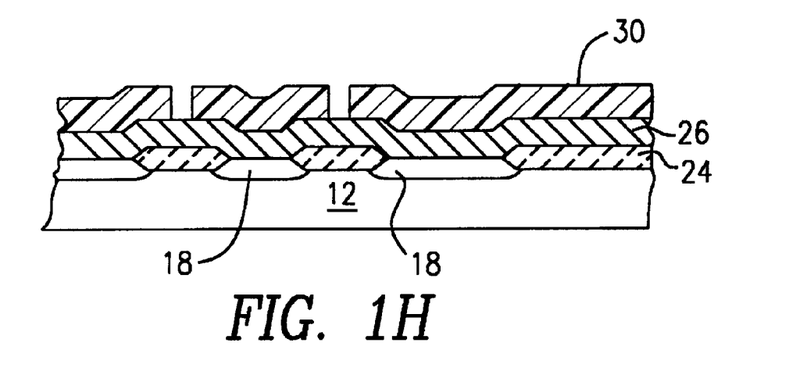

A layer of photoresist 30 is then deposited atop the aluminum and is patterned using a second photolithographic masking step to form openings in the photoresist 30, as FIG.

Figure 1I:
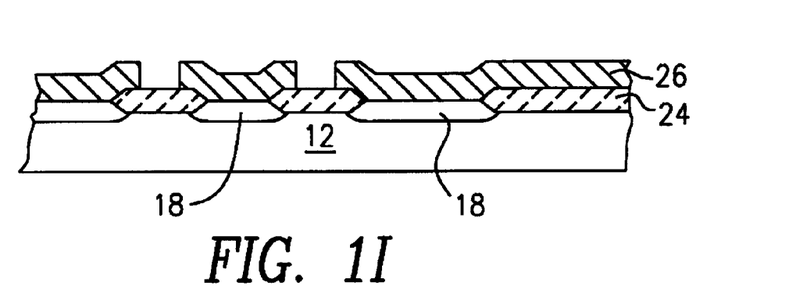

1H shows. The photoresist layer 30 is then used to mask an anisotropic etch step of the aluminum layer 26 to form openings therein which expose one or more ring-shaped borders as well as expose portions of the LOCOS oxide layer 24, as FIG. 1I shows.

Figure 1J:
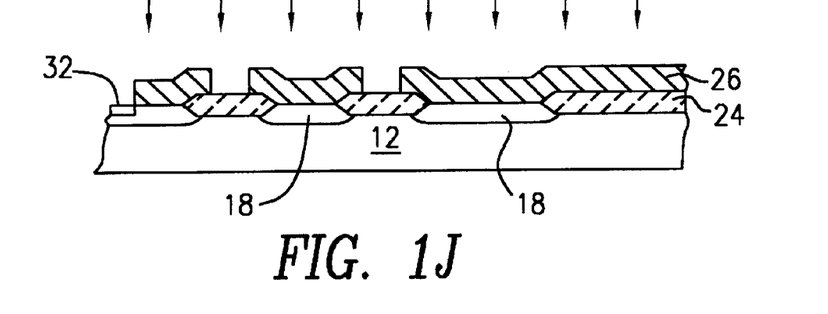

Then, the photoresist layer 30 is stripped, and N+ arsenic or phosphorus is implanted through the openings in the aluminum layer 26 into the exposed borders 32 to form equipotential (EQR) rings. Typically, the implant is carried out and an energy of about 120 to 150 KeV and at a dose of about 5 E15 to 2 E16. The N+ implant is then annealed at a temperature of between 350 to 450° C., for example.

Figure 1K:
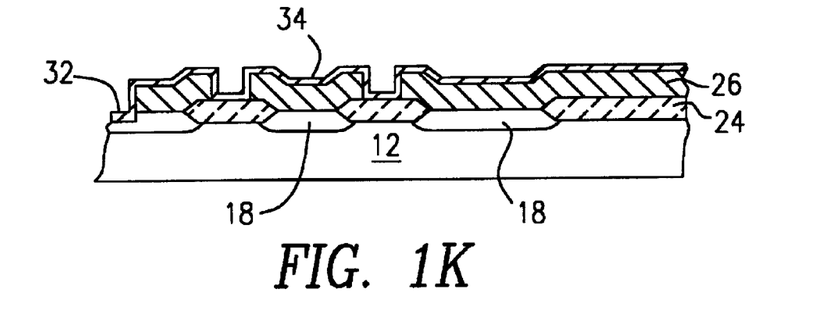
Figure 1L:
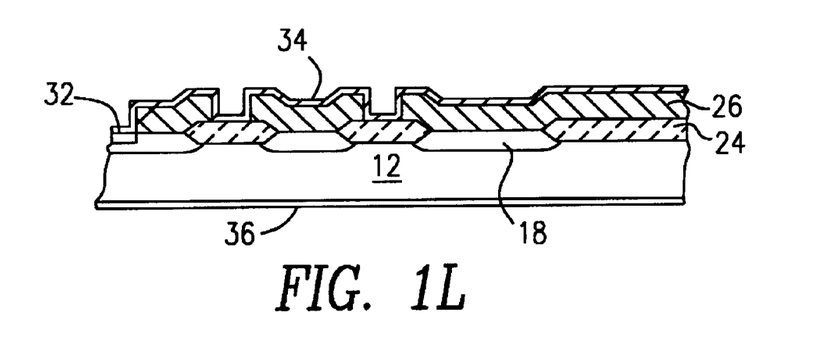

Subsequently, a thin layer of amorphous silicon 34 is evaporated onto the top surface and sidewalls of the aluminum layer 26 as well as onto the exposed portions of the silicon and the LOCOS oxide 24, as shown in FIG. 1K. A contact metal layer 36, such as Cr—Ni—Ag, is then deposited on the back side of the wafer, as FIG. 1L shows.

Figure 3A:
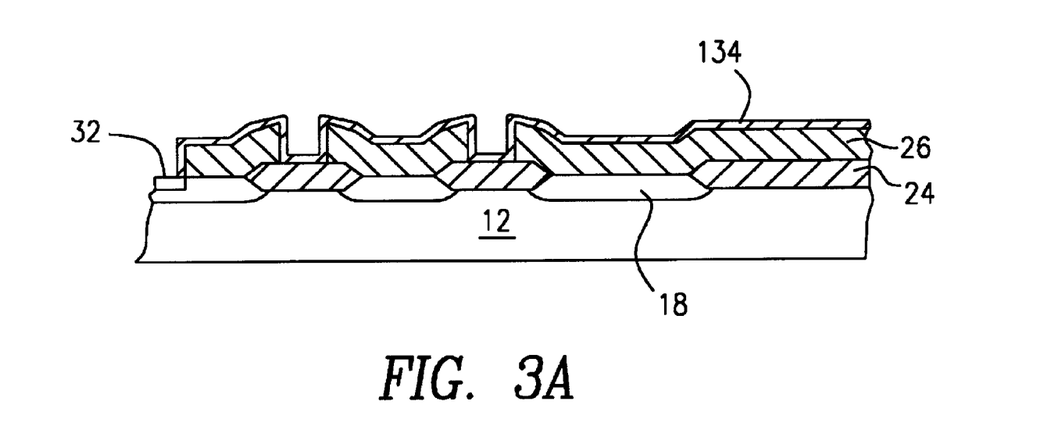
FIGS. 3A–3E show cross-sectional views of the final steps of a three masking step manufacture process of a portion of a FRED chip in which the initial process steps are shown in FIGS. 1A to 1J.
Figure 3B:
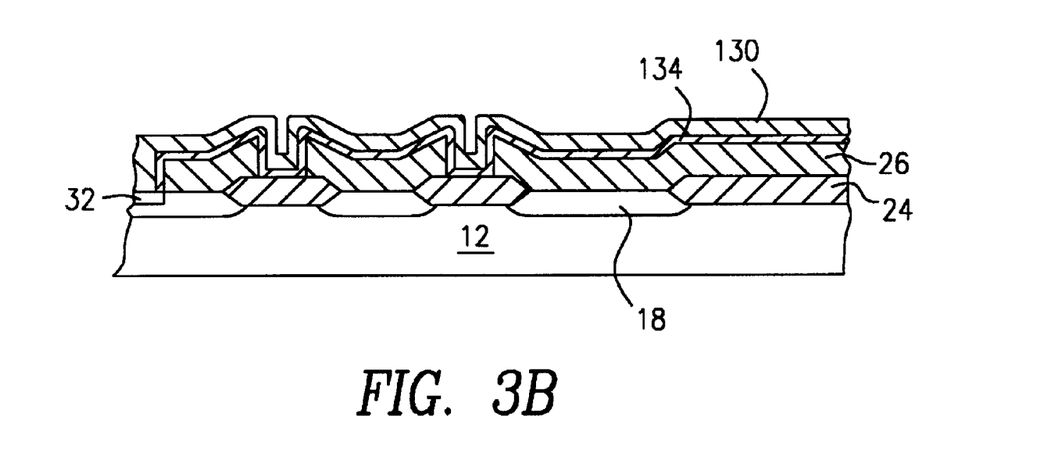
Figure 3C:
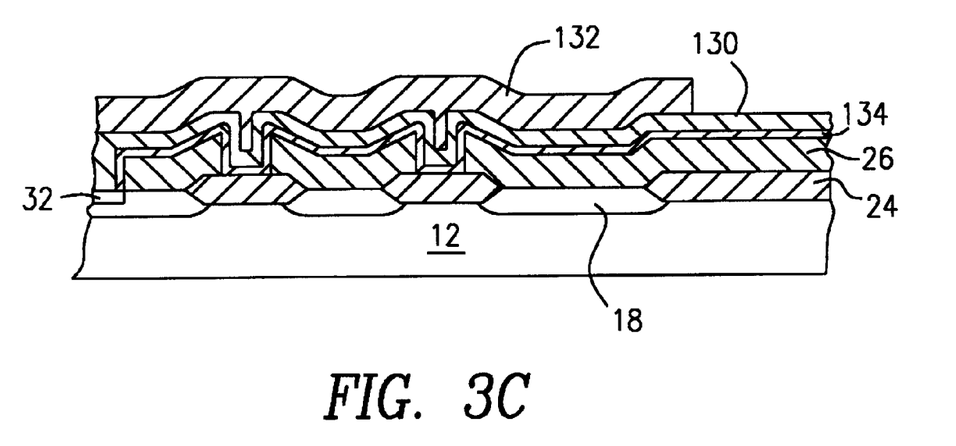
Figure 3D:
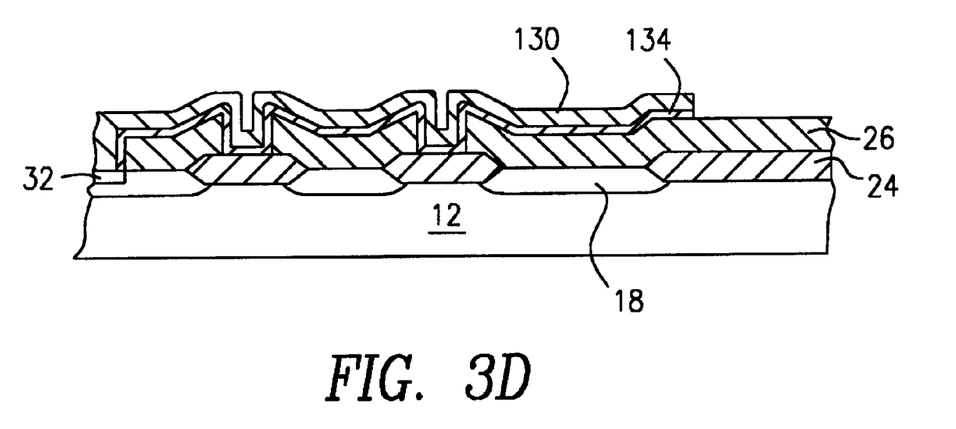
Figure 3E:
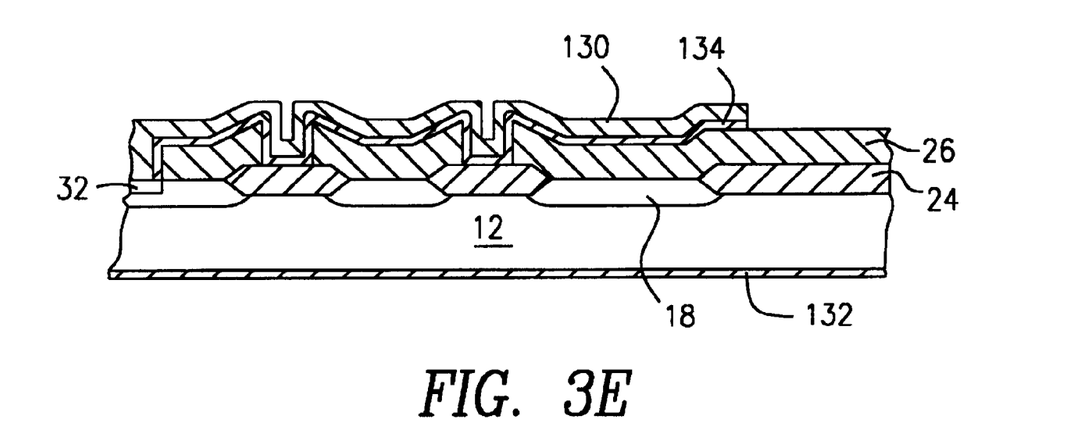

The process shown in FIGS. 1A to 1L is suitable for the manufacture of FRED devices having a breakdown voltage that is rated at less than 800 volts. However, for devices that are rated at a higher breakdown voltage, the initial part of the process is carried out as shown in FIGS. 1A to 1J but is then modified as follows and as shown in FIGS. 3A to 3E:

After the deposition of an amorphous silicon layer 134 shown in FIG. 3A, a layer of plasma-enhanced, chemical vapor deposited silicon nitride 130 is formed on the top surface of the wafer to provide an additional passivation layer as FIG. 3B shows. Then, a photoresist layer 132 is deposited atop the nitride layer, and a third photolithographic masking step is carried out to form openings that define the passivated areas, shown in FIG. 3C. The exposed portion of the silicon nitride layer is then etched, and the photoresist layer is stripped as FIG. 3D shows. A back side metal layer 136 is then deposited, as shown in FIG. 3E.

An alternative process according to the invention is shown in FIGS. 2A to 2K. Here, a phosphorous doped LTO layer is deposited and reflowed in place of the LOCOS oxide layer.

Figure 2A:
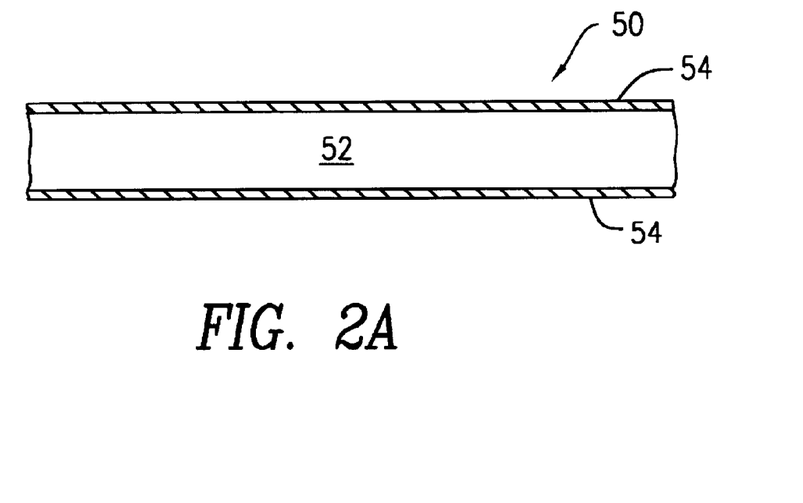
FIGS. 2A–2K show cross-sectional views of the process for the manufacture of a FRED chip according to another process of the invention.
Figure 2B:
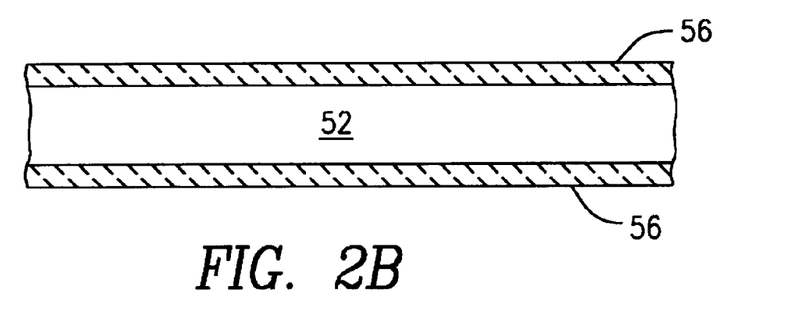

Initially, a 10,000 to 15,000 angstroms thick, for example, layer of field oxide 54 is grown on the top and bottom surfaces of wafer 52, as FIG. 2A shows. Then, as FIG. 2B shows, a 6000 to 10,000 angstroms thick layer of LTO, which includes 3 to 9 percent phosphorous, is deposited on the top and bottom surfaces and is reflowed at a temperature of 900–1000° C. for 30 to 60 minutes to form combined oxide and LTO layer 56.

Figure 2C:
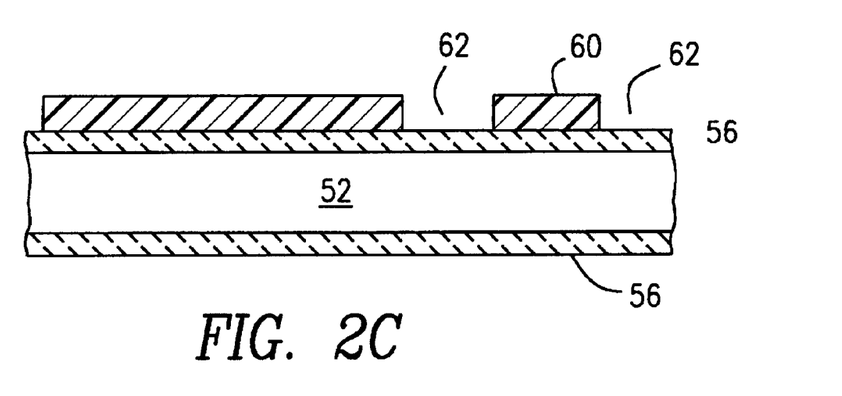
Figure 2D:
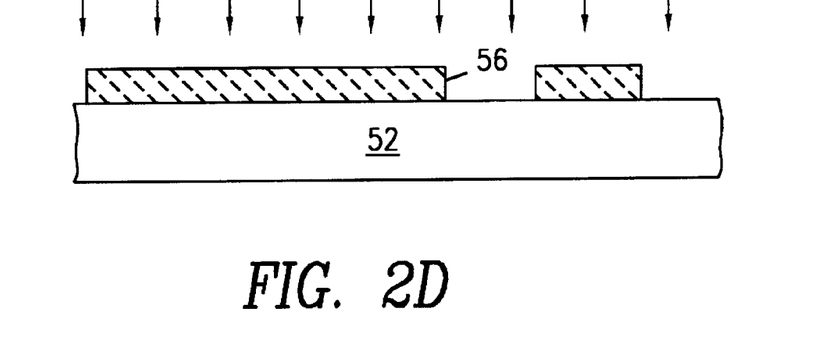

A layer of photoresist 60 is then deposited on the top surface of the wafer and is patterned in first photolithographic masking step, as FIG. 2C shows. The first photolithographic step defines the termination and active areas of the FRED device. The exposed portion of the combined LTO and field oxide layers 56 on the top and bottom surfaces are then removed, as FIG. 2D shows, and the remaining portion of the LTO and field oxide layer 56 is used to mask a P+ boron implant step. The ion implant step is typically carried out at an energy of 50 to 80 KeV at a dose of from 1 E13 to 1 E15.

Figure 2E:
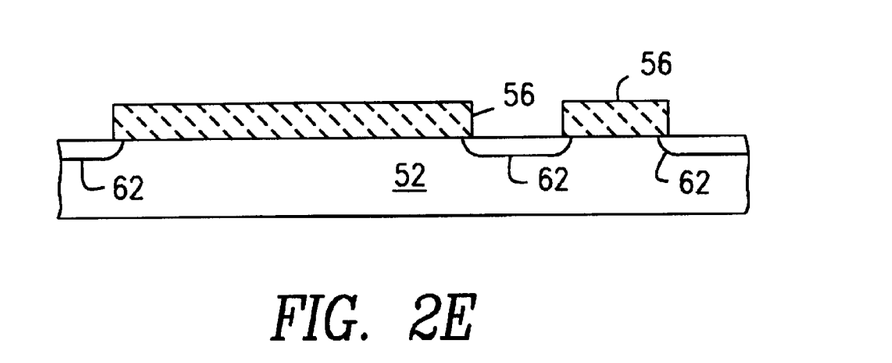

Thereafter, the photoresist layer 60 is removed, and the boron implant is driven in for between 120 to 240 minutes at a temperature of about 1100 to 1200° C. to form P well regions 62 shown in FIG. 2E. A diluted hydrofluoric acid etch for about 10 minutes is then carried out to deglass the active regions of the device.

Figure 2F:
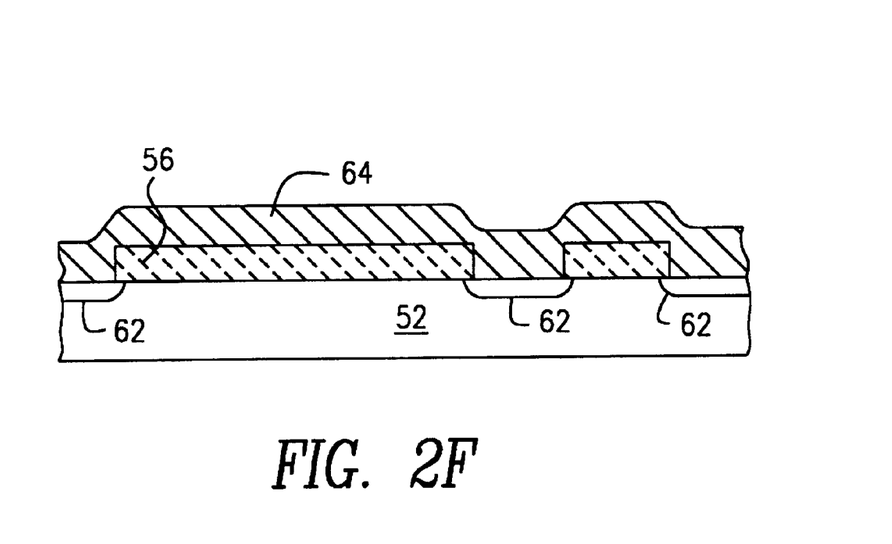
Figure 2G:
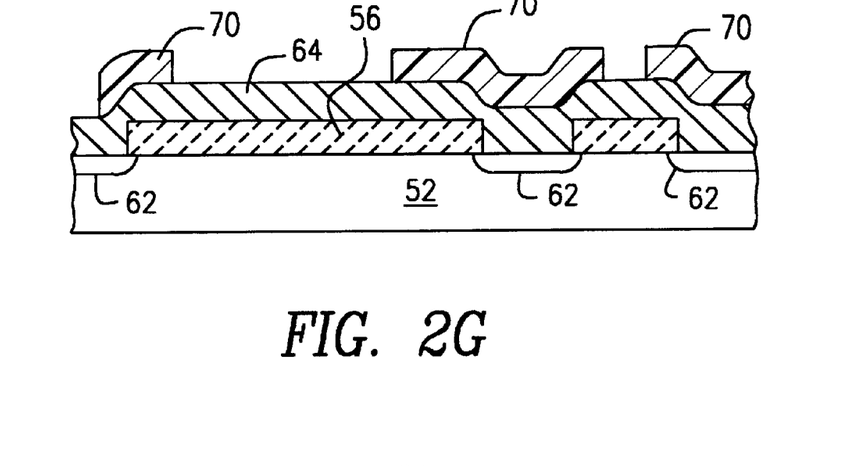
Figure 2H:
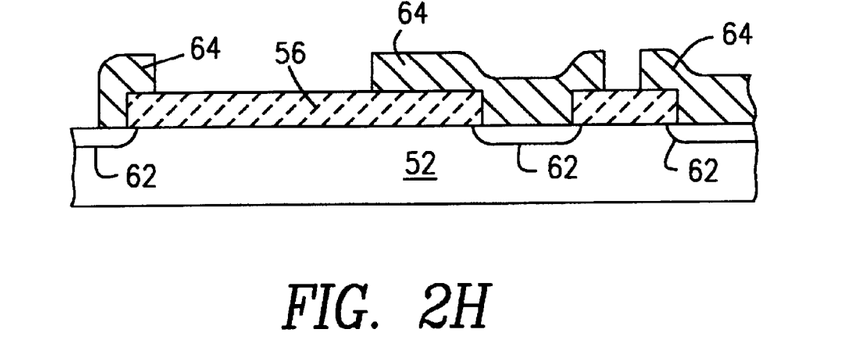
Figure 2I:
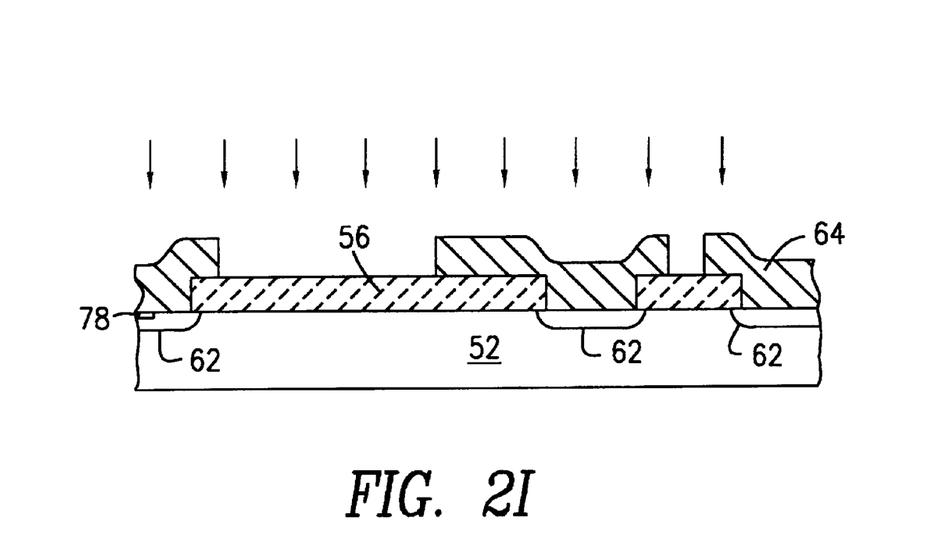

A 3 micron thick layer of aluminum 64 is then sputtered onto the front side of the wafer, as shown in FIG. 2F. Then, another layer of photoresist 70 is deposited atop aluminum layer 64 and is patterned by a second photolithographic masking step shown in FIG. 2G. The photoresist layer 70 masks a subsequent etch of the aluminum layer which exposes the termination region of the device as well as portions of the LTO layer 56, as FIG. 2H shows. An N+ phosphorous or arsenic implant is then carried out into the exposed regions of the LTO layer 56. Typically, the N+ dopants are implanted at an energy of about 120 to 150 KeV at a dose of between 5 E15 to 2 E16 and serves to form one or more EQR rings 78 in the termination region as shown in FIG. 2I. The wafer is then annealed at a temperature of 350 to 450° C. for 30 to 60 minutes.

Figure 2J:
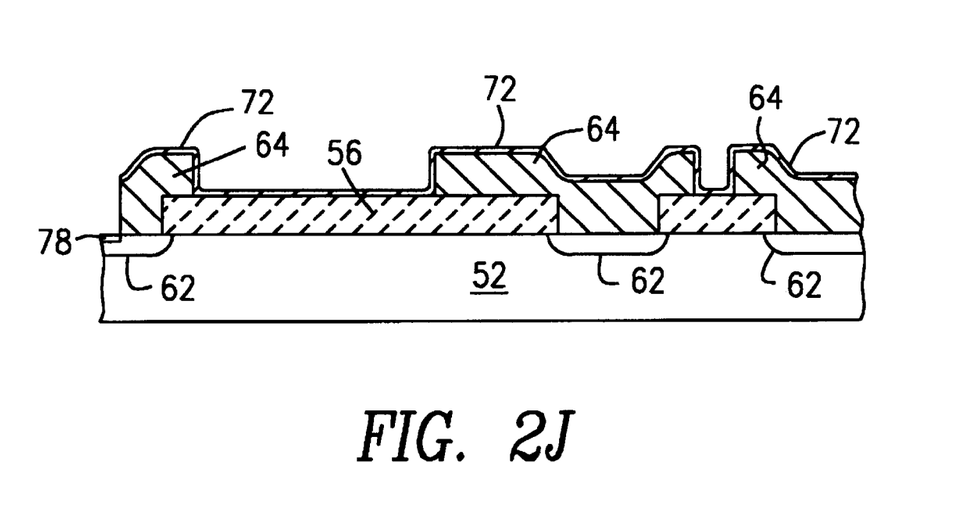
Figure 2K:
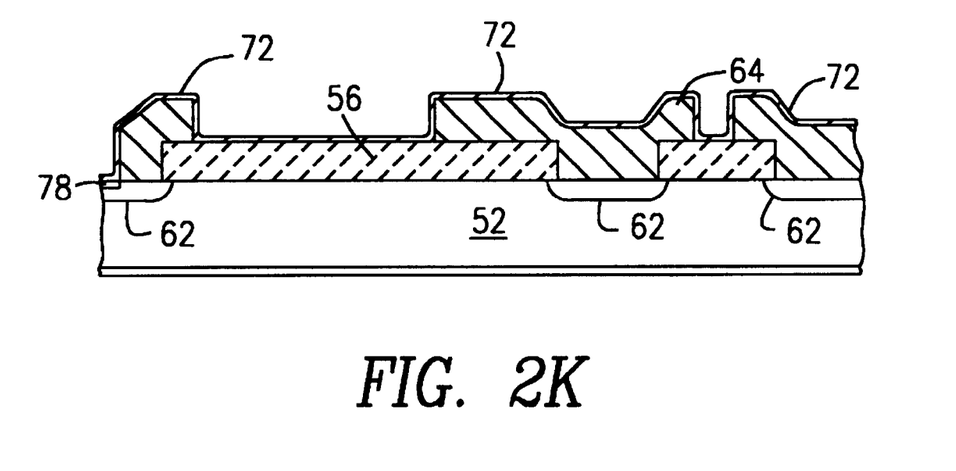

An amorphous silicon layer 72 is then deposited on the front side of the wafer, as FIG. 2J shows, and a contact metal, which is typically Cr—Ni—Ag, is deposited on the back side of the wafer, as FIG. 2K shows.

The above two masking step process is suitable for the manufacture of devices whose breakdown voltage is less than 800 volts. A three masking step process is required, however, to make devices whose breakdown voltage is greater than 800 volts and is shown in FIGS. 4A to 4D.

Figure 4A:
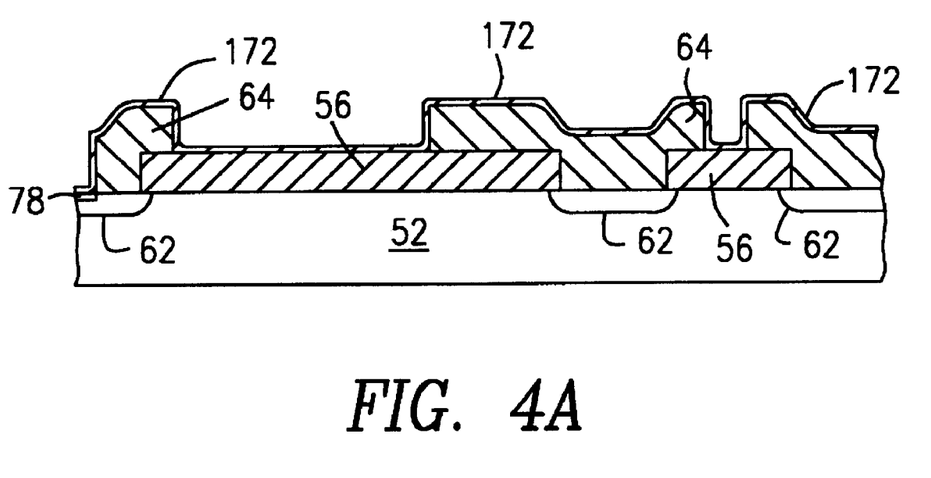
FIGS. 4A–4E show cross-sectional views of the final steps of a three mask process for the manufacture of a portion of a FRED chip in which the initial process steps shown in FIGS. 2A–2I.
Figure 4B:
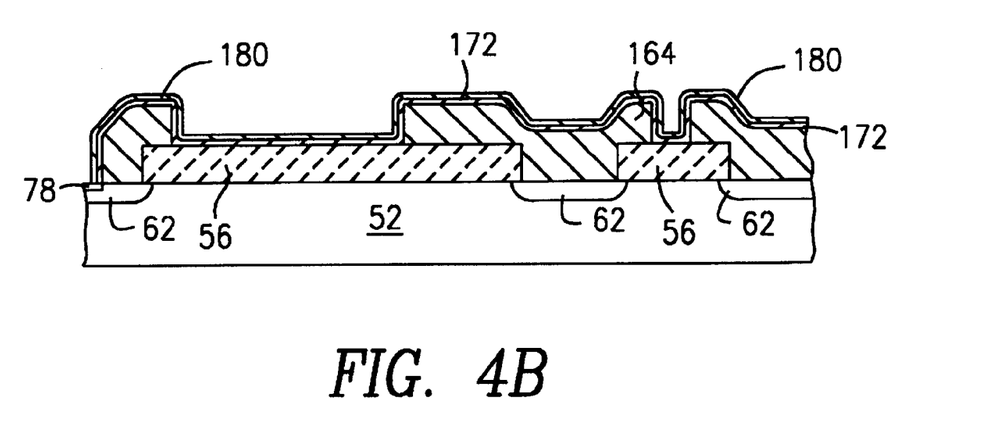
Figure 4C:
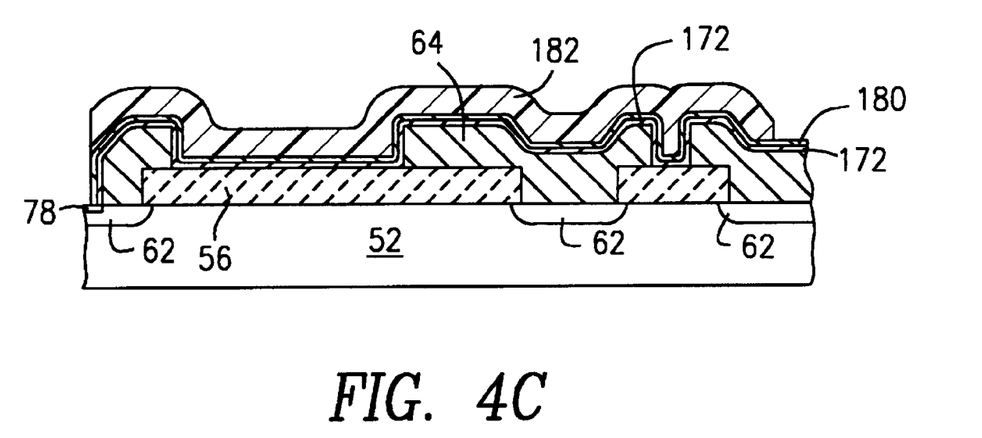
Figure 4D:
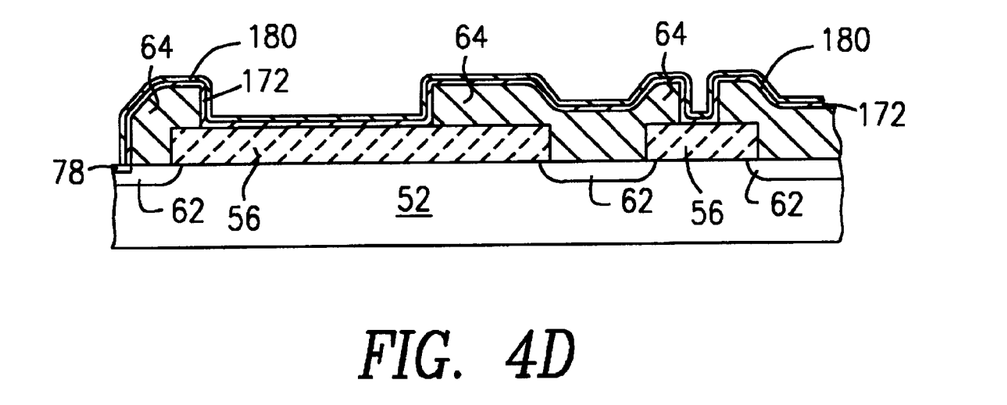
Figure 4E:
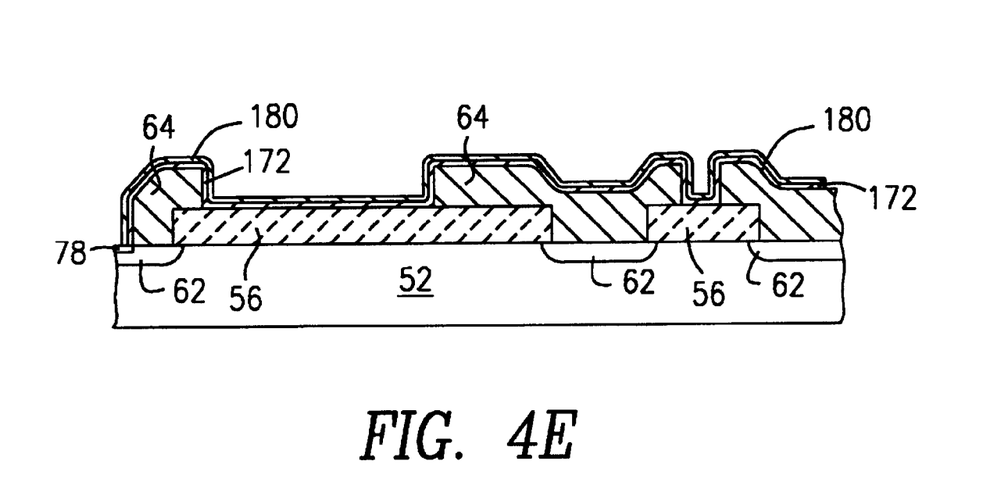

The initial steps of the three masking step process is similar to those shown in FIGS. 2A–2I. Then, a layer of plasma-enhanced, chemical vapor deposited silicon nitride 180 is formed over amorphous silicon layer 172 as shown in FIGS. 4A and 4B. A layer of photoresist 182 is then deposited, and a third masking step is carried out to define the passivated area as FIG. 4C shows. The exposed portions of the silicon nitride layer are then etched, as depicted in FIG. 4D and the photoresist layer is removed. Then, the back side metals layer 174 shown in FIG. 4E is deposited.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for fabricating a semiconductor device, said process comprising the steps of:

forming at least one layer of a first insulation material atop an upper surface of a silicon substrate of one conductivity type;

introducing a blanket layer of impurities of another conductivity type into said upper surface of said silicon substrate;

patterning and etching away, using a single mask, selected regions of said first insulation material and said layer of impurities of another conductivity type to form a plurality of openings which expose underlying regions of said upper surface of said silicon substrate;

forming localized oxide regions in said underlying regions of said silicon substrate;

removing said layer of first insulation material to expose remaining, unoxidized regions of said silicon substrate;

depositing an upper conductive layer;

patterning and etching away selected portions of said upper conductive layer to form openings which expose at least a bordering portion of said silicon substrate; and introducing impurities of said one conductivity type into said openings of said bordering portion to form equipotential rings.

2. The process of claim 1 wherein said step of forming at least one layer of first insulation material includes forming an oxide layer on said upper surface of said silicon substrate and forming a nitride layer atop said oxide layer.

3. The process of claim 1 wherein said step of forming localized oxide regions includes diffusing said impurities of said another conductivity type for a time of between 120 to 240 minutes.

4. The process of claim 1 further comprising the step of annealing said silicon substrate after introducing said impurities of said one conductivity type.

5. The process of claim 1 wherein said conductive layer includes aluminum.

6. The process of claim 1 further comprising the step of depositing an overlying layer of amorphous silicon, and depositing a further conductive layer on a bottom surface of said silicon substrate.

7. The process of claim 6 wherein said further conductive layer includes Cr—Ni—Ag.

8. The process of claim 1 further comprising the steps of depositing an overlaying layer of silicon nitride, patterning and etching away selected regions of said silicon nitride layer, and depositing a further conductive layer on a bottom surface of said silicon substrate.

9. The process of claim 8 wherein said further conductive layer includes Cr—Ni—Ag.

10. The process of claim 1 further comprising the step of etching away a portion of said underlying regions of said silicon substrate prior to forming said localized oxide regions.

11. A process for fabricating a semiconductor device, said process comprising the steps of:

forming at least one layer of insulation material on at least an upper surface of a silicon substrate of one conductivity type;

patterning and etching away selected regions of said insulation material to form a plurality of openings therein which expose underlying regions of said upper surface of said silicon substrate;

introducing impurities of another conductivity type into said underlying regions of said silicon substrate to form diffused regions;

depositing an upper conductive layer on top of said diffused regions and said insulating material;

patterning and etching away selected regions of said upper conductive layer to form openings therein which expose at least bordering regions of said upper surface of said silicon substrate; and introducing impurities of said one conductivity type into said bordering regions to form at least one equipotential ring.

12. The process of claim 11 wherein said step of forming a layer of insulation material includes forming a layer of silicon dioxide on said upper surface of said silicon substrate, and forming a low temperature oxide layer atop said silicon dioxide layer.

13. The process of claim 11 wherein said step of introducing impurities of said another conductivity type includes diffusing said impurities for a time of between 120 to 240 minutes.

14. The process of claim 11 further comprising the step of annealing said silicon substrate after introducing said impurities of said one conductivity type.

15. The process of claim 11 wherein said conductive layer includes aluminum.

16. The process of claim 11 further comprising the step of depositing an overlying layer of amorphous silicon, and depositing a further conductive layer on a bottom surface of said silicon substrate.

17. The process of claim 16 wherein said further conductive layer includes Cr—Ni—Ag.

18. The process of claim 11 further comprising the steps of depositing an overlaying layer of silicon nitride, patterning and etching away selected regions of said silicon nitride layer, and depositing a further conductive layer on a bottom surface of said silicon substrate.

19. The process of claim 18 wherein said further conductive layer includes Cr—Ni—Ag.

20. The process of claim 11 wherein said at lest one layer of insulation material is further deposited on a bottom surface of said silicon substrate.

* * * * *